United States Patent
Ravasio et al.

(10) Patent No.: US 10,777,743 B2
(45) Date of Patent: Sep. 15, 2020

(54) MEMORY CELL WITH INDEPENDENTLY-SIZED ELECTRODE

(71) Applicant: Micron Technology, Inc., Boise, ID (US)

(72) Inventors: Marcello Ravasio, Olgiate Molgora (IT); Samuele Sciarrillo, Lomagna (IT); Andrea Gotti, Vaprio D'Adda (IT)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 15/792,842

(22) Filed: Oct. 25, 2017

(65) Prior Publication Data

US 2018/0047896 A1  Feb. 15, 2018

Related U.S. Application Data (60) Continuation of application No. 14/972,152, filed on Dec. 17, 2015, now Pat. No. 9,831,428, which is a
(Continued)

(51) Int. Cl.
*H01L 45/00* (2006.01)
*H01L 27/105* (2006.01)
(Continued)

(52) U.S. Cl.
CPC ............ *H01L 45/124* (2013.01); *H01L 21/28* (2013.01); *H01L 21/3213* (2013.01);
(Continued)

(58) Field of Classification Search
CPC ... H01L 45/124; H01L 27/2427; H01L 45/16; H01L 45/1675; H01L 45/06;
(Continued)

(56) References Cited

U.S. PATENT DOCUMENTS 4,390,404 A   6/1983   Esho et al.
5,629,235 A *  5/1997   Liu .......................... H01L 21/28
                                              257/E21.158
(Continued)

FOREIGN PATENT DOCUMENTS

CN           102270739 A      12/2011

OTHER PUBLICATIONS

Williams et al. ("Etch Rates for Micromachining Processing—Part II" Journal of Microelectromechanical Systems, vol. 12, No. 6, Dec. 2003).*
(Continued)

*Primary Examiner* — Marcos D. Pizarro
*Assistant Examiner* — Sue Tang
(74) *Attorney, Agent, or Firm* — Brooks, Cameron & Huebsch, PLLC (57) ABSTRACT

Memory cell architectures and methods of forming the same are provided. An example memory cell can include a switch element and a memory element. A middle electrode is formed between the memory element and the switch element. An outside electrode is formed adjacent the switch element or the memory element at a location other than between the memory element and the switch element. A lateral dimension of the middle electrode is different than a lateral dimension of the outside electrode.

11 Claims, 8 Drawing Sheets

Related U.S. Application Data division of application No. 14/036,788, filed on Sep. 25, 2013, now Pat. No. 9,257,431.

(51) Int. Cl.
| | | |
|---|---|---|
| *H01L 21/28* | (2006.01) | |
| *H01L 27/24* | (2006.01) | |
| *H01L 27/22* | (2006.01) | |
| *H01L 21/3213* | (2006.01) | |

(52) U.S. Cl.
CPC ........ *H01L 27/1052* (2013.01); *H01L 27/222* (2013.01); *H01L 27/2427* (2013.01); *H01L 27/2463* (2013.01); *H01L 45/04* (2013.01); *H01L 45/06* (2013.01); *H01L 45/1233* (2013.01); *H01L 45/1253* (2013.01); *H01L 45/14* (2013.01); *H01L 45/144* (2013.01); *H01L 45/146* (2013.01); *H01L 45/16* (2013.01); *H01L 45/1675* (2013.01)

(58) Field of Classification Search
CPC ... H01L 45/1233; H01L 27/222; H01L 45/04; H01L 45/146; H01L 45/144; H01L 45/14; H01L 45/1253; H01L 27/2463; H01L 21/3213
USPC ........................................................ 257/528
See application file for complete search history.

(56) References Cited

U.S. PATENT DOCUMENTS

| | | | |
|---|---|---|---|
| 6,185,122 B1* | 2/2001 | Johnson | G11C 11/5692 |
| | | | 257/E27.073 |
| 6,709,874 B2 | 3/2004 | Ning | |
| 7,435,648 B2 | 10/2008 | Hsu et al. | |
| 7,888,711 B2 | 2/2011 | Cheung et al. | |
| 7,943,515 B2 | 5/2011 | Scheuerlein | |
| 7,989,789 B2 | 5/2011 | Toda | |
| 8,173,987 B2 | 5/2012 | Lung | |
| 8,274,067 B2 | 9/2012 | Ahn et al. | |
| 8,404,514 B2 | 3/2013 | Lee et al. | |
| 8,409,915 B2 | 4/2013 | Smythe et al. | |
| 8,416,609 B2 | 4/2013 | Meade | |
| 8,729,523 B2 | 5/2014 | Pio | |
| 9,257,431 B2 | 2/2016 | Ravasio et al. | |
| 2004/0183107 A1 | 9/2004 | Horii et al. | |
| 2006/0151771 A1 | 7/2006 | Asano et al. | |
| 2006/0289942 A1 | 12/2006 | Horii et al. | |
| 2007/0284635 A1 | 12/2007 | Fournier | |
| 2008/0068879 A1* | 3/2008 | Ahn | G11C 11/5678 |
| | | | 365/163 |
| 2008/0111120 A1* | 5/2008 | Lee | H01L 45/1233 |
| | | | 257/2 |
| 2008/0191188 A1* | 8/2008 | Jeong | G11C 11/56 |
| | | | 257/4 |
| 2008/0304308 A1 | 12/2008 | Stipe | |
| 2009/0258255 A1 | 10/2009 | Terashima et al. | |
| 2009/0267042 A1 | 10/2009 | Happ et al. | |
| 2009/0267043 A1 | 10/2009 | Chang | |
| 2009/0321711 A1* | 12/2009 | Takagi | H01L 27/101 |
| | | | 257/5 |
| 2010/0207094 A1* | 8/2010 | Kanzawa | H01L 27/101 |
| | | | 257/4 |
| 2010/0232200 A1 | 9/2010 | Shepard | |
| 2010/0238704 A1* | 9/2010 | Komura | G11C 13/0004 |
| | | | 365/148 |
| 2010/0248431 A1 | 9/2010 | Nishitani et al. | |
| 2010/0321979 A1* | 12/2010 | Yasutake | H01L 27/1021 |
| | | | 365/148 |
| 2011/0084248 A1 | 4/2011 | Hsieh et al. | |
| 2011/0089507 A1 | 4/2011 | Mao | |
| 2011/0095257 A1 | 4/2011 | Xu et al. | |
| 2011/0147690 A1 | 6/2011 | Yang | |
| 2011/0215436 A1 | 9/2011 | Tang et al. | |
| 2011/0278527 A1 | 11/2011 | Ishibashi | |
| 2011/0278528 A1 | 11/2011 | Lung et al. | |
| 2012/0225534 A1 | 9/2012 | Lee et al. | |
| 2012/0235109 A1* | 9/2012 | Nojiri | H01L 27/101 |
| | | | 257/4 |
| 2012/0261638 A1 | 10/2012 | Sills et al. | |
| 2013/0009122 A1 | 1/2013 | Park et al. | |
| 2013/0187114 A1 | 7/2013 | Kai et al. | |

OTHER PUBLICATIONS

Kau et al., "A Stackable Cross-Point Phase Change Memory," IEEE Xplore, Dec. 2009, pp. 27.1.1-27.1.4.

Meyer et al., "Oxide Dual-Layer Memory Element for Scalable Non-Volatile Cross-Point Memory Technology," IEEE Technology, Nov. 2008, 5 pp.

Bez, "Phase Change Memory: State of the Art and Perspective," 11th Leti Annual Review, Jun. 22-24, 2009, 34 pp.

Malventano, "Intel and Numonyx announce vertical Phase Change Memory," PC Perspective, Oct. 28, 2009, http://www.pcper.com/news/Storage/Intel-and-Numonyx-announce-vertical-Phase-Change-Memory, 2 pp.

Savage, "Numonyx Makes Stackable Phase-Change Memory," IEEE Spectrum, Nov. 17, 2009, http://spectrum.ieee.org/semiconductors/memory/numonyx-makes-stackable-phasechange-memory, 3 pp.

Wong, "Emerging Memories," Department of Electrical Engineering, Stanford University, Stanford, California, Apr. 3, 2008, 77 pp.

\* cited by examiner

MEMORY CELL WITH INDEPENDENTLY-SIZED ELECTRODE

PRIORITY INFORMATION

This application is a Continuation of U.S. application Ser. No. 14/972,152 filed Dec. 17, 2015, which is a Divisional of U.S. application Ser. No. 14/036,788 filed Sep. 25, 2013, now U.S. Pat. No. 9,257,431, the specification of which is incorporated herein by reference.

TECHNICAL FIELD

The present disclosure relates generally to semiconductor devices, and more particularly to memory cell architectures and methods of forming the same.

BACKGROUND

Memory devices are typically provided as internal, semiconductor, integrated circuits in computers or other electronic devices. There are many different types of memory, including random-access memory (RAM), read only memory (ROM), dynamic random access memory (DRAM), synchronous dynamic random access memory (SDRAM), resistance variable memory, and flash memory, among others. Types of resistance variable memory include phase change material (PCM) memory, programmable conductor memory, and resistive random access memory (RRAM), among others.

Non-volatile memory is utilized as memory devices for a wide range of electronic applications in need of high memory densities, high reliability, and data retention without power. Non-volatile memory may be used in, for example, personal computers, portable memory sticks, solid state drives (SSDs), digital cameras, cellular telephones, portable music players such as MP3 players, movie players, and other electronic devices.

Constant challenges related to memory device fabrication are to decrease the size of a memory device, increase the storage density of a memory device, reduce power consumption, and/or limit memory device cost. Some memory devices include memory cells arranged in a two dimensional array, in which memory cells are all arranged in a same plane. In contrast, various memory devices include memory cells arranged into a three dimensional (3D) array having multiple levels of memory cells.

DETAILED DESCRIPTION

Memory cell architectures and methods of forming the same are provided. An example memory cell can include a switch element and a memory element. A middle electrode is formed between the memory element and the switch element. An outside electrode is formed adjacent the switch element or the memory element at a location other than between the memory element and the switch element. A lateral dimension of the middle electrode is different than, e.g., less than, a lateral dimension of the outside electrode.

Embodiments of the present disclosure implement a memory cell in a cross point memory array in which the dimensions of the middle electrode, e.g., located between a memory element and a switch element are independent from the dimensions of outside electrodes, e.g., bottom electrode and/or top electrode. Reducing lateral dimension(s) of the middle electrode can increase the current density at the middle electrode/memory element contact surface area for a given amount of input power, thereby improving the effectiveness to induce memory element phase transitions due to thermal budget on the memory element, e.g., increased heat generated by localized increased current flow. Additionally, reducing lateral dimension(s) of the middle electrode can reduce the risk of stringer formation during etch of a conductive line located above the memory cell, e.g., bit line etch.

The figures herein follow a numbering convention in which the first digit or digits correspond to the drawing figure number and the remaining digits identify an element or component in the drawing. Similar elements or components between different figures may be identified by the use of similar digits. For example, 106 may reference element "06" in FIG. 1, and a similar element may be referenced as 306 in FIG. 3A. Also, as used herein, "a number of" a particular element and/or feature can refer to one or more of such elements and/or features.

As used herein, the term "substantially" intends that the modified characteristic needs not be absolute, but is close enough so as to achieve the advantages of the characteristic. For example, "substantially parallel" is not limited to absolute parallelism, and can include orientations that are at least closer to a parallel orientation than a perpendicular orientation. Similarly, "substantially orthogonal" is not limited to absolute orthogonalism, and can include orientations that are at least closer to a perpendicular orientation than a parallel orientation.

Figure 1:
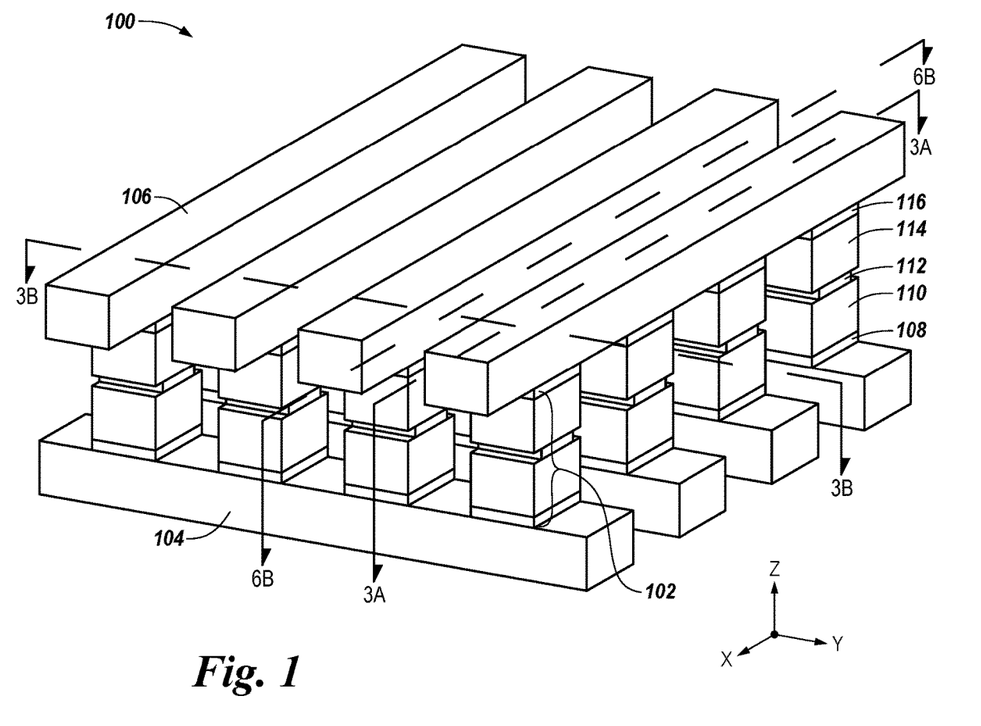
FIG. 1 is a perspective view of a portion of a memory array in accordance with a number of embodiments of the present disclosure.

FIG. 1 is a perspective view of a portion of a memory array 100 in accordance with a number of embodiments of the present disclosure. The cross point array 100 of memory cells shown in FIG. 1 can be created through dry etch patterning in two perpendicular directions, e.g., corresponding to the direction of the conductive lines 104 underlying the memory cells, e.g., word lines, and the conductive lines 106 overlying the memory cells, e.g., bit lines. Materials corresponding to respective conductive lines and components of the memory cell can be bulk deposited as a stack of materials and etched to form the various features, e.g., pillars of materials. The dry etch patterning in two perpendicular directions forms the various conductive lines, fin structure, and ultimately pillars corresponding to individual memory cells.

For example, a first etch can define underlying conductive lines and one direction of the pillar, e.g., a fin structure separated by first trenches, from the stack of materials. The sides of the pillar can be self-aligned to the underlying conductive lines, e.g., word lines 304, which in turn can be connected to other circuitry. A second etch can define overlying conductive lines and the other direction of the pillar. Additional etches can be used to independently size various material components of the fin structures and/or pillars, as described further below.

In the example shown in FIG. 1, memory array 100 is a cross point memory. However, embodiments of the present disclosure are not so limited. For example, embodiments of the present disclosure can comprise a three dimensional (3D) cross point memory with more decks of word line and bit lines with memory cells therebetween.

Array 100 can be a cross-point array having memory cells 102 located at the intersections of a number of conductive lines, e.g., access lines 104, which may be referred to herein as word lines, and a number of conductive lines, e.g., data/sense lines 106, which may be referred to herein as bit lines. As illustrated in FIG. 1, word lines 104 can be parallel or substantially parallel to each other and can be orthogonal to bit lines 106, which can be parallel or substantially parallel to each other. However, embodiments are not so limited. Word lines 104 and/or bit lines 106 can be a conductive material such as tungsten, copper, titanium, aluminum, and/or other metals, for example. However, embodiments are not so limited. In a number of embodiments, array 100 can be a portion, e.g., a level, of a three-dimensional array, e.g., a multi-level array, (described further with respect to FIG. 2) in which other arrays similar to array 100 are at different levels, for example above and/or below array 100.

Each memory cell 102 can include a memory element 114, e.g., storage element, coupled in series with a respective switch element 110, e.g., selector device, and/or access device. The memory cell can have a number of electrodes adjacent the memory element 114 and switch element 110, including a first, e.g., bottom, electrode, second, e.g., middle, electrode, and/or third, e.g., top, electrode. The memory element 114 can be, for example, a resistive memory element. The memory element 114 can be formed between a pair of electrodes, e.g., third electrode 116 and second electrode 112. The memory element can be comprised of a resistance variable material such as a phase change memory (PCM) material, for example. As an example, the PCM material can be a chalcogenide alloy such as a Germanium-Antimony-Tellurium (GST) material, e.g., Ge—Sb—Te materials such as $Ge_2Sb_2Te_5$, $Ge_1Sb_2Te_4$, $Ge_1Sb_4Te_7$, $Ge_5Sb_5Te_5$, $Ge_4Sb_4Te_7$, etc., or an indium(In)-antimony(Sb)-tellurium(Te) (IST) material, e.g., $In_2Sb_2Te_5$, $In_1Sb_2Te_4$, $In_1Sb_4Te_7$, etc., among other phase change memory materials. The hyphenated chemical composition notation, as used herein, indicates the elements included in a particular mixture or compound, and is intended to represent all stoichiometries involving the indicated elements. Other phase change memory materials can include Ge—Te, In—Se, Sb—Te, Ga—Sb, In—Sb, As—Te, Al—Te, Ge—Sb—Te, Te—Ge—As, In—Sb—Te, Te—Sn—Se, Ge—Se—Ga, Bi—Se—Sb, Ga—Se—Te, Sn—Sb—Te, In—Sb—Ge, Te—Ge—Sb—S, Te—Ge—Sn—O, Te—Ge—Sn—Au, Pd—Te—Ge—Sn, In—Se—Ti—Co, Ge—Sb—Te—Pd, Ge—Sb—Te—Co, Sb—Te—Bi—Se, Ag—In—Sb—Te, Ge—Sb—Se—Te, Ge—Sn—Sb—Te, Ge—Te—Sn—Ni, Ge—Te—Sn—Pd, and Ge—Te—Sn—Pt, for example. However, embodiments of the present disclosure are not limited to a particular type of PCM material. Further, embodiments are not limited to memory elements comprising PCM materials. For instance, the memory elements can comprise a number of resistance variable materials such as binary metal oxides, colossal magnetoresistive materials, and/or various polymer-based resistive variable materials, among others.

For simplicity, FIG. 1 shows the memory element 114, switch element 110, and electrodes 108 and 116 all having similar dimensions in pillars, and middle electrode 112 having a smaller dimension in the "X" direction than the dimensions of the memory element 114, switch element 110, and electrodes 108 and 116 in the same ("X") direction. However, as is discussed below, a memory cell 102 can be formed with a middle electrode 112 having different dimension(s), e.g., smaller critical dimension(s), smaller cross-sectional area, smallest lateral dimension, etc., than the memory element 114, switch element 110, and/or the outside electrodes, e.g., electrodes 108 and 116. As used herein, "outside electrode" refers to an electrode formed in a location other than between the memory element 114 and the switch element 110. For example, the middle electrode 112 can be formed to have smaller dimensions than electrodes 108 and 116 in two corresponding directions, e.g., in the "Y" direction and the "X" direction. Also, bottom electrode 108 and switch element need not be confined to a pillar, and can extend continuously along the top of the word line 104, as shown and discussed with respect to FIG. 3B.

Figure 4A:
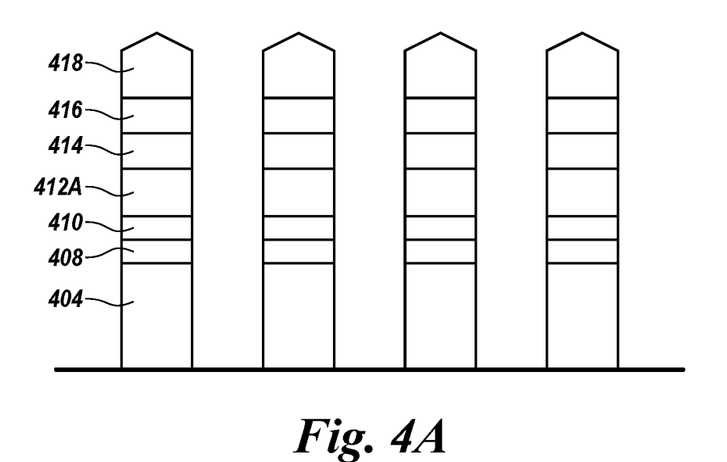
FIG. 4A illustrates a cross-sectional view of fin structures prior to independently-sizing middle electrodes in accordance with a number of embodiments of the present disclosure.
Figure 4B:
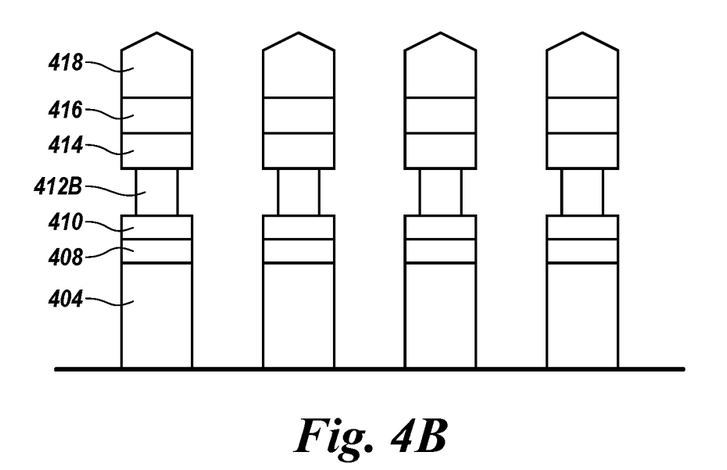
FIG. 4B illustrates a cross-sectional view of fin structures having independently-sized middle electrodes in accordance with a number of embodiments of the present disclosure.

As shown in FIG. 1, and discussed in greater detail with respect to FIG. 4B (among others), a middle electrode 112 can be recessed after an etch that defines a first conductive line, e.g., word line. That is, during a word line etch, a fin structure is formed self-aligned to the word line. Thereafter, the middle electrode 112 can be recessed to have a smaller dimension than the word line (and other component materials of the fin structure. However, embodiments of the present disclosure are not so limited, and the middle electrode 112 can alternatively or additionally be recessed after an etch that defines a second conductive line, e.g., bit line such that the middle electrode 112 is recessed in one or two directions, e.g., in a direction perpendicular to the direction in which a word line extends and/or in a direction perpendicular to the direction in which a bit line extends.

The switch element 110 can be a two terminal device such as a diode, an ovonic threshold switch (OTS), or an ovonic memory switch (OMS). However, embodiments of the present disclosure are not limited to a particular type of switch element 110. For example, the switch element 110 can be a field effect transistor (FET), a bipolar junction transistor (BJT), or a diode, among other types of selector devices. The switch element 110 can be formed between a pair of electrodes, e.g., the first electrode 108 and a second electrode 112. Although FIG. 1 illustrates a configuration having the memory element 114 formed over the switch element 110, embodiments of the present disclosure are not so limited.

According to various embodiments of the present disclosure the switch element 110 can be formed over the memory element 114, for example.

Electrodes 108, 112, and/or 116 can comprise materials such as Ti, Ta, W, Al, Cr, Zr, Nb, Mo, Hf, B, C, conductive nitrides of the aforementioned materials, e.g., TiN, TaN, WN, CN, etc.), and/or combinations thereof.

In a number of embodiments, the switch elements 110 corresponding to memory cells 102 can be OTS's having a chalcogenide selector device material. In such embodiments, the chalcogenide material of the switch element 110 may not actively change phase, e.g., between amorphous and crystalline, such as a chalcogenide resistance variable material of the memory element. Instead, the chalcogenide material of the switch element can change between an "on" and "off" state depending on the voltage potential applied across memory cell 102. For example, the "state" of the OTS can change when a current through the OTS exceeds a threshold current or a voltage across the OTS exceeds a threshold voltage. Once the threshold current or voltage is reached, an on state can be triggered and the OTS can be in a conductive state. In this example, if the current or voltage potential drops below a threshold value, the OTS can return to a non-conductive state.

In a number of embodiments, the memory element 114 can comprise one or more of the same material(s) as the switch element 110. However, embodiments are not so limited. For example, memory element 114 and switch element 110 can comprise different materials. Memory cells 102 can be programmed to a target data state, e.g., corresponding to a particular resistance state, by applying sources of an electrical field or energy, such as positive or negative electrical pulses, to the cells, e.g., to the storage element of the cells, for a particular duration. The electrical pulses can be, for example, positive or negative voltage or current pulses.

Figure 2:
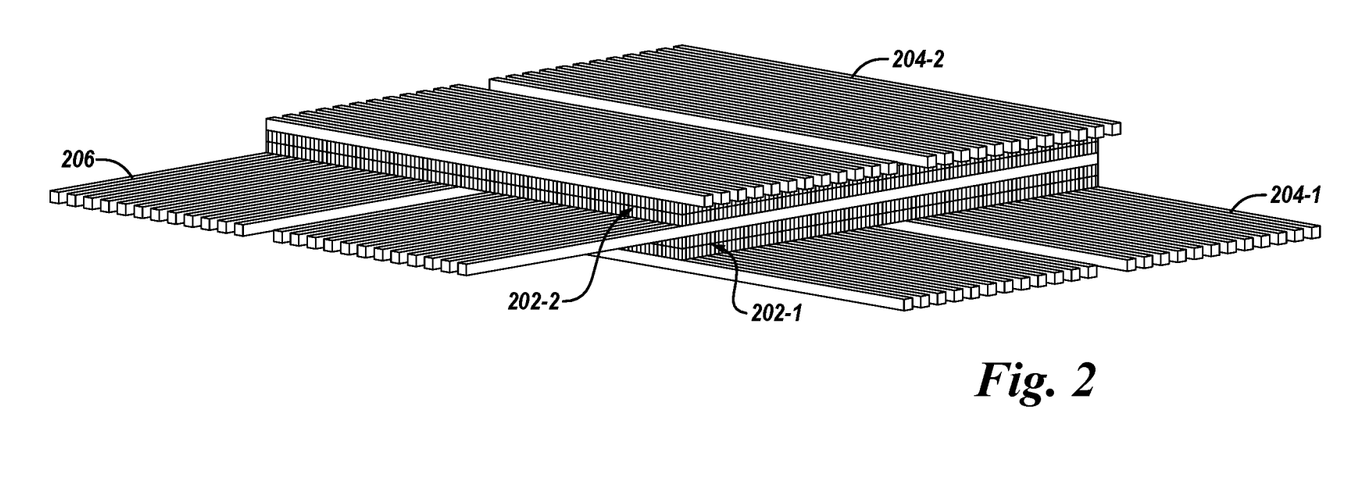
FIG. 2 illustrates a three dimensional memory array in accordance with a number of embodiments of the present disclosure.

FIG. 2 illustrates a three dimensional (3D) memory array in accordance with a number of embodiments of the present disclosure. The 3D memory array comprises a plurality of memory cells 202-1, 202-2, e.g., memory element in series with a switch element with a middle electrode having different dimension(s), e.g., smaller, than the memory element, switch element, and/or other electrodes as described with respect to FIG. 1. FIG. 2 shows a first memory array comprising memory cells 202-1 formed between word lines 204-1 and bits lines 206, and a second memory array comprising memory cells 202-2 formed between word lines 204-2 and bits lines 206. That is, the first memory array formed below bit lines 206 and the second memory array formed above bit lines 206 share common bit lines 206 therebetween.

FIG. 2 is a simplified diagram that does not precisely reflect the three dimensional physical dimensions of the various features illustrated, including the exact proximity of features to one another. FIG. 2 should not be considered as to be representative of the precise topological positioning of the various elements and electrodes of individual memory cells. Rather, FIG. 2 provides an overview of the electrical scheme for a 3D memory array, and the approximate relative arrangement of the various features. Although FIG. 2 shows a 3D array comprising 2 memory arrays, embodiments of the present invention are not so limited, and can include additional memory array(s) arranged into a number of levels.

Figure 3A:
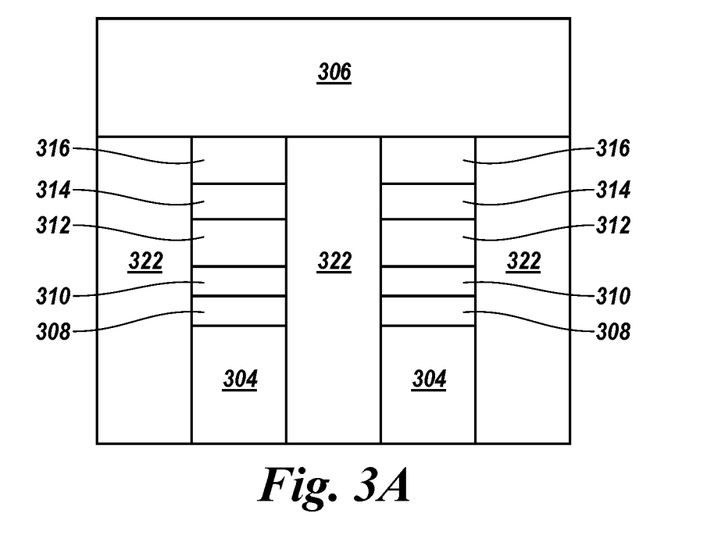
FIGS. 3A and 3B illustrate cross-sectional views of memory cells in perpendicular directions in accordance with a number of embodiments of the present disclosure.
Figure 3B:
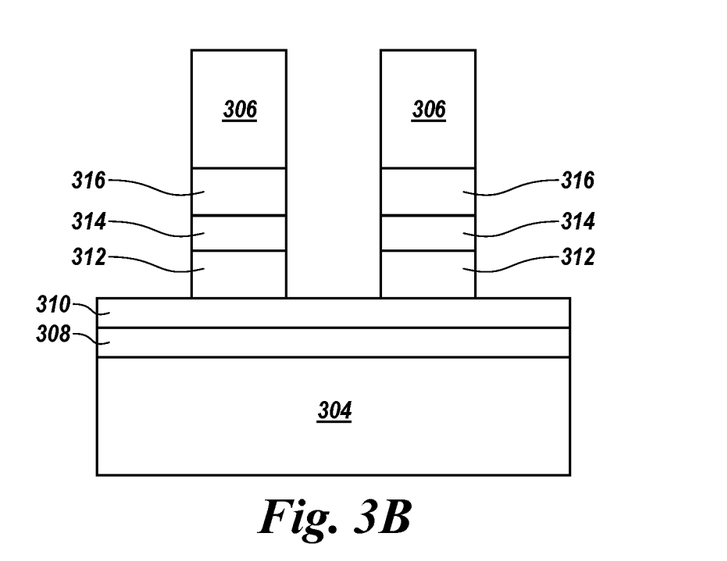

FIGS. 3A and 3B illustrate cross-sectional views of memory cells in perpendicular directions in accordance with a number of embodiments of the present disclosure. The orientation of the view shown in FIG. 3A through the pillars is shown by cutline 3A-3A in FIG. 1. The orientation of the view shown in FIG. 3B, also through the pillars but in a direction perpendicular to that of cut line 3A-3A, is shown by cutline 3B-3B in FIG. 1 (except that in FIG. 1 the bottom electrode and switch element are shown being part of the pillar whereas in FIG. 3A they are not).

In FIGS. 3A and 3B, the pillars of materials are shown being square when viewed from the side and end perspectives. FIG. 3A shows a cross-section in a first direction, e.g., side view, of a portion of a memory array, such as that shown in FIG. 1. FIG. 3B shows a cross-section in a second direction, e.g., end view, of a portion of a memory array, such as that shown in FIG. 1. FIGS. 3A and 3B show some additional detail than that shown and described with respect to FIG. 1. The memory cells shown in FIGS. 3A and 3B can be similar to those described with respect to FIGS. 1 and 2.

As shown in FIG. 3A, a stack of materials can be formed over a word line 304. For example, the stack of materials can include a first electrode 308, e.g., bottom electrode, formed over a first conductive line 304, e.g., word line, a switch element 310 formed over the first electrode 308, a second electrode 312, e.g., middle electrode, formed over the switch element 310, a memory element 314 formed over the second electrode 312, and a third electrode 316 formed over the memory element 314. The stack of materials can be etched to form fin structures self-aligned with the first conductive line 304, and the trenches between the fin structures can be filled-in with dielectric material 322.

Subsequent to deposit of the dielectric material 322 between the fin structures, a conductive material, e.g., metal film, can be deposited on top of the fin structures and dielectric material 322. An additional etch process can be used to form second trenches that define second conductive line 306, e.g., bit lines, in a direction perpendicular to the trenches used to define the word lines 304 and fin structures. Pillars corresponding to respective memory cells that are separated from one another can be self-aligned to the bit lines 306. Thereafter, an additional etch can be used to independently size one or more components of the pillars, e.g., the second electrode, as described further with respect to FIGS. 4A and 4B below, and the second trenches can also be filled-in with dielectric material to isolate the array of active pillars corresponding to memory cells from one another. Above and below the array of memory cells, self-aligned conductive lines extend in perpendicular directions to connect the array to associated circuitry.

Although FIGS. 3A and 3B show components of the pillar having similar measurements in each of several directions, embodiments of the present disclosure are not so limited. According to various embodiments, the second electrode 312 can be independently-sized after the word line etch to have a smaller lateral dimension than other fin components in a particular corresponding direction. That is, the middle electrode can have a smallest lateral dimension in a particular direction with respect to other materials comprising a fin structure created by the word line etch in the corresponding, e.g., same, particular direction. The middle electrode can be independently-sized after the word line etch by the process illustrated and described below. The pillars can alternatively or additionally be etched after the bit line etch to independently-size pillar component(s), e.g., middle electrode.

FIG. 4A illustrates a cross-sectional view of fin structures prior to independently-sizing middle electrodes in accordance with a number of embodiments of the present disclosure. The orientation of the view shown in FIG. 4A through the pillars is a similar orientation as that shown by cutline 3A-3A in FIG. 1. FIG. 4A shows an end view of fin structures self-aligned to underlying conductive lines. The fin structures shown in FIG. 4A include a first electrode 408, e.g., bottom electrode, formed over a first conductive line 404, e.g., word line, a switch element 410 formed over the first electrode 408, a second electrode 412A, e.g., middle electrode, formed over the switch element 410, a memory element 414 formed over the second electrode 412A, and a third electrode 416 formed over the memory element 414. FIG. 4A also shows a hard mask 418, used to pattern the first conductive line 404 and fin structures.

For many reasons, the first electrode 408, second electrode 412, and third electrode 416 can be formed from materials that include carbon (C). However, embodiments of the present disclosure are not so limited, and electrodes can be formed of other materials that have low resistivity and are not active with the chalcogenide alloy used for the memory element and/or switch element.

Carbon has electric properties such as a viable resistivity for application as an electrode of a memory cell, and can be easily patterned with an extremely high selectivity towards inorganic hard masks, such as hard mask 418 shown in FIG. 4A. Ability to easily pattern electrodes is increasingly important as stack complexity increases. Electrodes can have a critical dimension (CD) defined by the CD of the hard mask 418, and if the word line profile is substantially vertical, the electrodes can have dimensions substantially similar to the hard mask 418 used for patterning. Critical dimension (CD) is the finest line resolvable associated with etch patterning, e.g., etching using a pattern to delineate areas to be etched from areas not to be etched.

FIG. 4B illustrates a cross-sectional view of fin structures having independently-sized middle electrodes in accordance with a number of embodiments of the present disclosure. The orientation of the view shown in FIG. 4B is a similar orientation as that shown by cutline 3B-3B in FIG. 1. According to various embodiments of the present disclosure, the second electrode 412B, e.g., middle electrode formed between the switch element 410 and memory element 414, can be sized independently from other components of the fin structure, as shown in FIG. 4B. With respect to second electrode 412A shown in FIG. 4A, second electrode 412B shown in FIG. 4B has a lateral dimension in the horizontal direction that is less than a lateral dimension in the horizontal direction of the other components of the fin structure, including the other electrodes, memory element 414 and switch element 410.

Changing the lateral dimension the second electrode from that shown for second electrode 412A to that of second electrode 412B has several advantages. Reducing one or both lateral dimensions of the second electrode with respect to the lateral dimension(s) of the memory element 414 can reduce the areas of the middle electrode 412B/memory element 414 contact surfaces, thereby increasing the current density, which can improve the effectiveness to induce phase transitions in the memory element 414. Additionally, reducing one or both lateral dimensions of the second electrode, such as is shown for second electrode 412B, can reduce the risk of stringer defect formation during the etch to define overlying conductive lines, e.g., bit line etch, as is described further with respect to FIGS. 5A-8B below.

According to various embodiments of the present disclosure, the second electrode, e.g., 412A shown in FIG. 4A and 412B shown in FIG. 4B can be formed of a material that has a higher etch rate than the material from which one or more other electrodes are formed. For example, the second electrode can be formed of a material that has a higher etch rate when etched with $O_2$-based chemistries than the material from which one or more other electrodes are formed. According to some embodiments, the second electrode can be etched with $O_2$-based chemistries that can have minimal effect on the memory element 414, switching element 410, and inorganic hard mask 418.

According to certain embodiments of the present disclosure, after an etch to define conductive lines, e.g., word lines 404, along with the two sides of a fin structure, an additional isotropic etch using an $O_2$-based plasma with the bias voltage off can be used to laterally recess the second electrode as shown for second electrode 412B in FIG. 4B. For example, the additional isotropic etch can be an $O_2$ flash process.

According to particular embodiments of the present disclosure, the second electrode, e.g., 412A shown in FIG. 4A and 412B shown in FIG. 4B, can be formed from combination of carbon and nitrogen (CNx), where "x" may be a positive integer, but can include other (non-integer) ratios. For example, nitrogen can be in the range of 2%-50% of the stoichiometric compound. However, embodiments are not limited to this range, and can include more or less nitrogen. Other electrodes, e.g., first electrode 408 and third electrode 416, can be formed of carbon (C), e.g., without nitrogen. Where the first electrode 408 and third electrode 416 are formed of carbon, and the second electrode 412A/B is formed of CNx, the additional isotropic etch using an $O_2$-based plasma with the bias voltage off can modify all carbon-based electrodes (with minimal impact on other materials such as the memory element 414, switch element 410, and hard mask 418). However, since the CNx material has a higher etch rate than that of carbon, e.g., absent the nitrogen, the second electrode can recess faster than the other carbon-based electrodes.

With careful tuning of the plasma conditions and/or composition of the various electrode(s), it is possible to have a tunable second electrode, e.g., middle electrode, recession with negligible erosion of the other electrodes, e.g., top electrode and/or bottom electrode. As such, it is possible to independently size the second electrode with respect to the other electrodes and/or memory element 414 and/or switch element 410. In this manner, a lateral dimension of the second electrode can be changed to be less than a lateral dimension of other electrodes and/or memory element 414 and/or switch element 410. For example, a smallest lateral dimension of the second electrode in at least one of the X- and/or Y-directions (shown in FIG. 1) can be changed to be less than a smallest lateral dimension of other electrodes and/or memory element 414 and/or switch element 410 in the corresponding direction.

As is shown in FIG. 4B, recessing the second electrode can create a negative step below the memory element 414. That is, the memory element 414 can overhang the second electrode 412B. This geometry can have advantages in avoiding stringer defect formation as is discussed below.

Although FIG. 4B shows recession of the second electrode 412B after the fin structures shown in FIG. 4A are completely formed, e.g., down to include conductive lines, e.g., word lines 404, definition, embodiments of the present disclosure are not so limited. According to some embodiments, the second electrode 412B can be recessed after the fin structures are partially formed so as to expose the second electrode 412B, e.g., only the top electrode 416, memory element 414, and second electrode 412B are exposed. At, or after, this stage of processing, the second electrode 412B can then be recessed. Thereafter, the balance of the fin structure, including conductive lines, can be formed. The same can occur if the second electrode 412B is being recessed during an etch to self-align the vertical structure to and define a bit line. That is, the second electrode 412B can be recessed any time after it is exposed by either the word line etch and/or the bit line etch.

Although FIG. 4B describes recessing the second electrode 412B, embodiments of the present disclosure are not so limited, and other components of the fin structure (self-aligned with word line) and/or vertical structure (self-aligned with both word line and bit line) can be recessed independently or in combination with recession of the second electrode 412B. That is, according to some embodiments of the present disclosure the first electrode 408 and/or the third electrode 416 can be formed of a different composition than other electrodes, e.g., CNx, and thus recessed in a similar manner as that described for recessing the second electrode 412B.

Figure 5A:
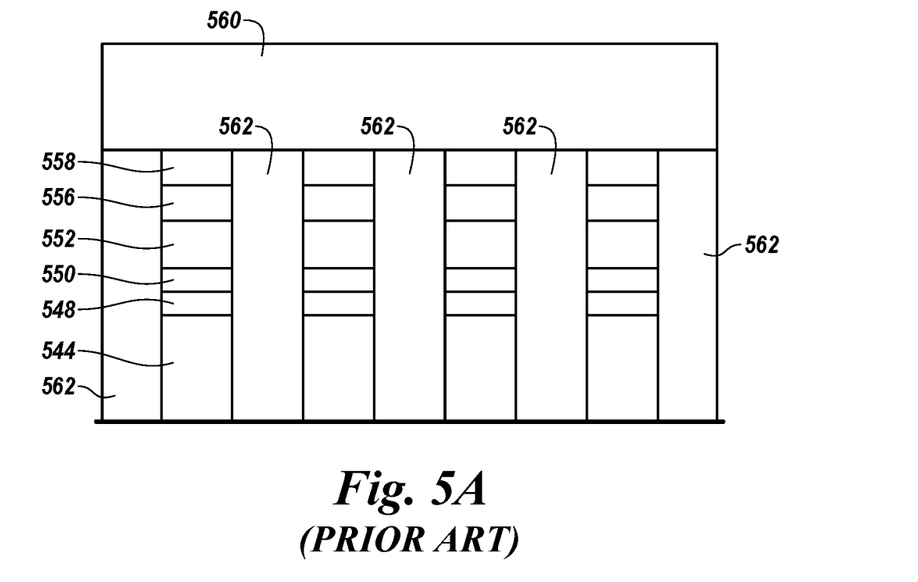
FIGS. 5A and 5B illustrate previous approach cross-sectional views in parallel directions at different locations of memory cells having stringer defects.
Figure 5B:
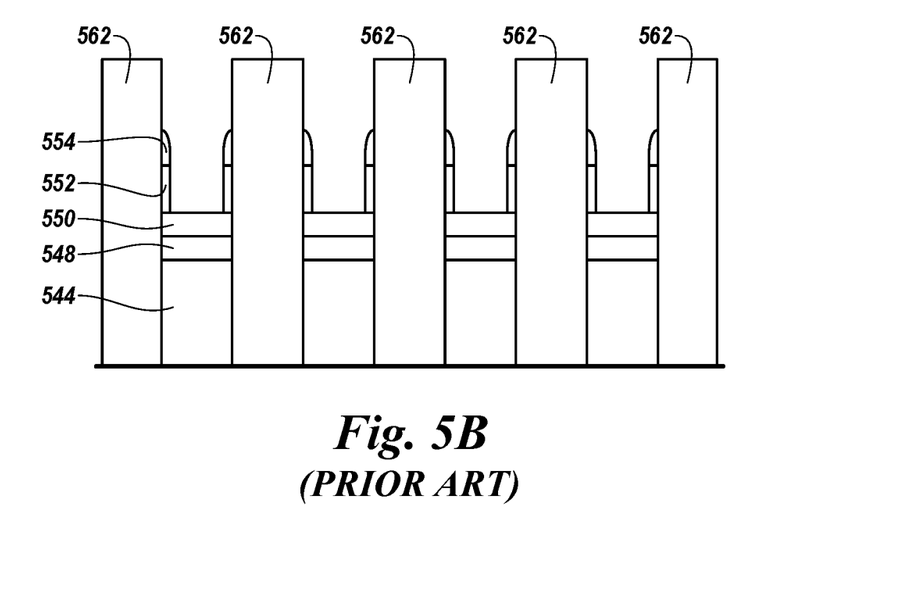

FIGS. 5A and 5B illustrate previous approach cross-sectional views in parallel directions at different locations of memory cells having stringer defects. FIG. 5A shows a cross-sectional side view sliced through an overlying conductive line, e.g., bit line 560, with pillars separated by dielectric material 562 (in a similar orientation as that shown by cutline 3A-3A in FIG. 1), except that the second electrode 552, e.g., middle electrode, is not recessed. Each pillar shown in FIG. 5A includes a first electrode 548, e.g., bottom electrode, formed over a first conductive line 544, e.g., word line, a switch element 550 formed over the first electrode 548, a second electrode 552, e.g., middle electrode, formed over the switch element 550, a memory element 556 formed over the second electrode 552, and a third electrode 558 formed over the memory element 556. The bit line 560 extends left-right across the top of the pillars and interposing dielectric 562.

FIG. 5B shows a cross-sectional view in an orientation parallel to the view shown in FIG. 5A, but sliced at a location between the bit lines 560 shown in FIG. 5A. Portions of the previous fin structures after the bit line etch are shown in FIG. 5B, with the fin structures between the bit lines 560 being etched down to the switch element 550. That is, the second electrode 552 has been etched by the bit line etch to the extent shown in FIG. 5B.

During the bit line etch, the second electrode 552 can be affected by polymers 554 redeposited during memory element patterning or by the word line profile, e.g., etching the stack of materials to form the underlying conductive lines, e.g., word lines. As used herein, the term "polymers" refers to byproducts created by etching process that have a low volatility and so are difficult to remove. For example, polymers 554 can be deposited on the trench walls in the vicinity of where the memory element 556 is removed during the bit line etch as shown in FIG. 5B. Theses polymers 554 redeposited on the trench walls during the bit line etch can shadow a portion of the previous approach carbon-based second electrode 552 shown underneath the polymers 554 as shown in FIG. 5B. This can lead to the formation of conductive carbon stringers.

While the polymers 554 in the vicinity of where the memory element 556 is removed during the bit line etch can be removed by a subsequent wet etch removal process, the portion of the previous approach carbon-based second electrode 552 remaining therebeneath can't be eliminated without also affecting the third electrode 558, e.g., top electrode. Therefore, according to a previous approach, the conductive stringer defect can remain in memory cells formed according to previous approaches, which can result in electrical defects in the memory cell operation, including column-to-column leakage current.

Figure 6A:
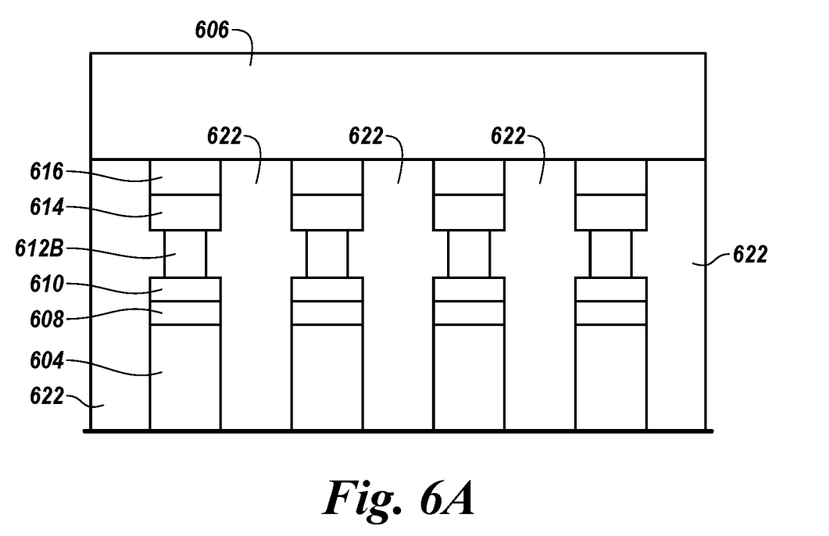
FIGS. 6A and 6B illustrate cross-sectional views of memory cells in parallel directions at different locations without stringer defects in accordance with a number of embodiments of the present disclosure.
Figure 6B:
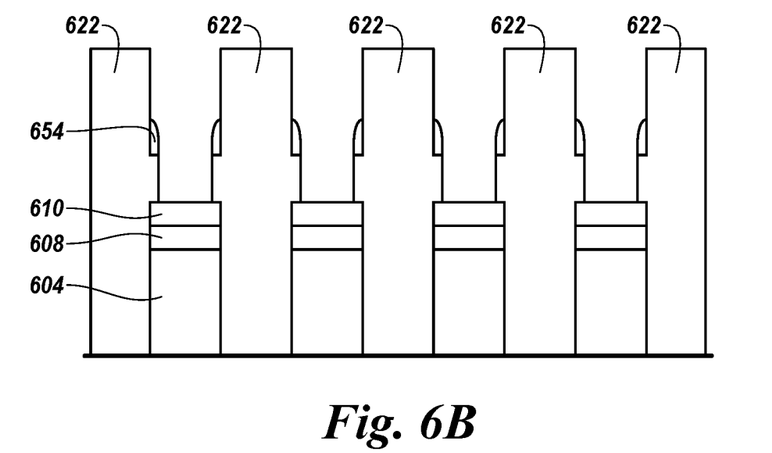

FIGS. 6A and 6B illustrate cross-sectional views of memory cells in parallel directions without stringer defects in accordance with a number of embodiments of the present disclosure. FIG. 6A shows a cross-sectional side view sliced through an overlying conductive line, e.g., bit line 606, with pillars separated by dielectric material 622. The orientation of the view shown in FIG. 6A is similar to that indicated in FIG. 1 by cutline 3A-3A.

Each pillar shown in FIG. 6A includes a first electrode 608, e.g., bottom electrode, formed over a first conductive line 604, e.g., word line, a switch element 610 formed over the first electrode 608, a second electrode 612B, e.g., middle electrode, formed over the switch element 610, a memory element 614 formed over the second electrode 612B, and a third electrode 616 formed over the memory element 614. The bit line 606 extends left-right across the top of the pillars and interposing dielectric 622. The view and memory cell configuration shown in FIG. 6B are similar to that shown in FIG. 4B (with the hard mask 418 removed and the overlying conductive line material deposited and patterned into conductive line 606, e.g., bit line. As illustrated in FIG. 6A, the second electrode 612B can be referred to as a middle electrode, and the first electrode 608 and/or the third electrode 616 can be referred to as an outside electrode.

FIG. 6B shows a cross-sectional end view in an orientation parallel to the view shown in FIG. 6A, but sliced at a location between the bit lines 606 shown in FIG. 6A. The orientation of the view shown in FIG. 6B is indicated in FIG. 1 by cutline 6B-6B. Portions of the previous fin structures after the bit line etch are shown in FIG. 6B, with the fin structures between the bit lines 606 being etched down to the switch element 610. That is, the second electrode 612B between the bit lines 606 has been etched away by the bit line etch to the extent shown in FIG. 6B.

FIG. 6B shows polymers 654 deposited on the trench walls in the vicinity of where the memory element 614 is removed during the bit line etch as shown in FIG. 6B. The polymers 654 are formed in a similar manner to that described above with respect to FIG. 5B. However, due to the recess in the second electrode 612B formed along the fin structure, and subsequent filling of dielectric material 622 between the fin structures, the material being shadowed by the polymers 654 is dielectric material 622 rather than material from which the second electrode 612B is formed. That is, the material being shadowed by the polymers 654 is insulative rather than conductive. What might have been conductive residuals were removed when the second electrode was recessed. Therefore, unlike previous approaches, column-to-column leakage is avoided since conductive stringer defects are eliminated.

Modification of the middle electrode, e.g., second electrode 412A shown in FIG. 4A and 412B shown in FIG. 4B, was previously discussed. An outside electrode can be modified by similar techniques such that the outside electrode can have a lateral dimension that is smaller than a lateral dimension of the middle electrode. For example, the middle electrode can be formed of carbon (C), e.g., without nitrogen, and the outside electrode(s) can be formed of CNx, where "x" may be a positive integer, but can include other (non-integer) ratios. For example, nitrogen can be in the range of 2%-50% of the stoichiometric compound. However, embodiments are not limited to this range, and can include more or less nitrogen. Where the outside electrode(s) are formed of CNx, and the middle electrode is formed of carbon, an additional isotropic etch using an $O_2$-based plasma with the bias voltage off can modify all carbon-based electrodes (with minimal impact on other materials such as the memory element, switch element, and hard mask). However, since the CNx material has a higher etch rate than that of carbon, e.g., absent the nitrogen, the outside electrode(s) can recess faster than the other carbon-based electrodes, e.g., the middle electrode. According to some embodiments, one outside electrode can be formed of CNx, and the middle electrode and other outside electrode can be formed of carbon, e.g., without nitrogen.

Figure 7A:
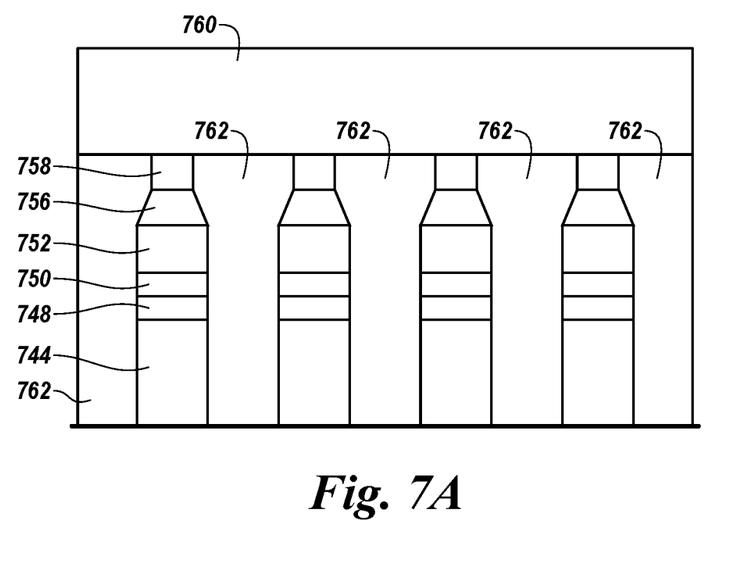
FIGS. 7A and 7B illustrate cross-sectional views of memory cells in parallel directions having tapered memory element in accordance with a number of embodiments of the present disclosure.
Figure 7B:
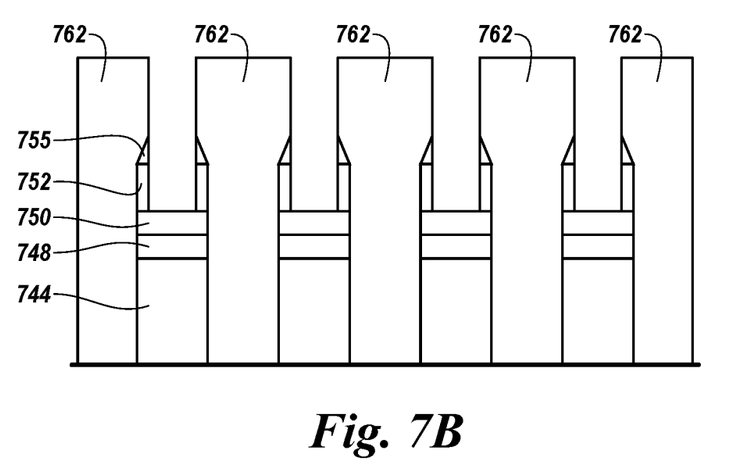

FIGS. 7A and 7B illustrate cross-sectional views of memory cells in parallel directions having tapered memory element in accordance with a number of embodiments of the present disclosure. FIG. 7A shows a cross-sectional side view sliced through an overlying conductive line, e.g., bit line 760 (in a similar orientation as that shown by cutline 3A-3A in FIG. 1), with pillars separated by dielectric material 762. Each pillar shown in FIG. 7A includes a first electrode 748, e.g., bottom electrode, formed over a first conductive line 744, e.g., word line, a switch element 750 formed over the first electrode 748, a second electrode 752, e.g., middle electrode, formed over the switch element 750, a memory element 756 formed over the second electrode 752, and a third electrode 758 formed over the memory element 756. The bit line 760 extends left-right across the top of the pillars and interposing dielectric 762.

FIG. 7A differs from the configuration shown in FIG. 5A. The memory element 556 shown in FIG. 5A has a vertical profile according to a previous approach. According to various embodiments of the present disclosure, the memory element 756 shown in FIG. 7A has a tapered profile, e.g., width is smaller at a higher elevation and gradually larger at lower elevations. Tapering of the memory element 756 can occur during etching of the fin structures and underlying conductive lines, e.g., word lines, from the bulk deposited stack of materials. For example, the tapering may occur because of recession of the third electrode 758, e.g., top electrode, or hard mask during an etch to form same.

FIG. 7B shows a cross-sectional view in an orientation parallel to the view shown in FIG. 7A, but sliced at a location between the bit lines 760 shown in FIG. 7A. FIG. 7B illustrates stringer defects that can occur (which is addressed below with respect to FIGS. 8A and 8B). Portions of the previous fin structures after the bit line etch are shown in FIG. 7B, with the fin structures between the bit lines 760 being etched down to the switch element 750. That is, the second electrode 752 has been etched by the bit line etch to the extent shown in FIG. 7B.

Stringer defect formation can also be attributable to the word line profile, e.g., etching the stack of materials to form the underlying conductive lines. Since bit line patterning, e.g., etching, is highly anisotropic, the dielectric material 762 located above the tapered portion 755 of the memory element 756 can shadow the tapered portion 755 of the memory element 756, which in turn can shadow the portion of the second electrode 752 therebelow. With this shadowing during the bit line etch according to a previous approach, a portion of the conductive second electrode 752 remains along the trench walls, thereby leading to a conductive stringer defect that can cause column-to-column leakage as previously described.

While the tapered portion 755 of the memory element 756 can be eliminated after the bit line etch by a subsequent long isotropic over etch, the conductive second electrode 752 material left underneath the tapered portion 755 of the memory element 756 cannot be removed without damaging the third electrode 758, e.g., top electrode, since, according to a previous approach, when the electrodes are all formed of a same material, or materials having very similar etch rates. That is, an etch that might be used to remove the conductive second electrode 752 material left underneath the tapered portion 755 of the memory element 756 would also consume material of the third electrode 758, which is already narrowed as shown in FIG. 7A.

Figure 8A:
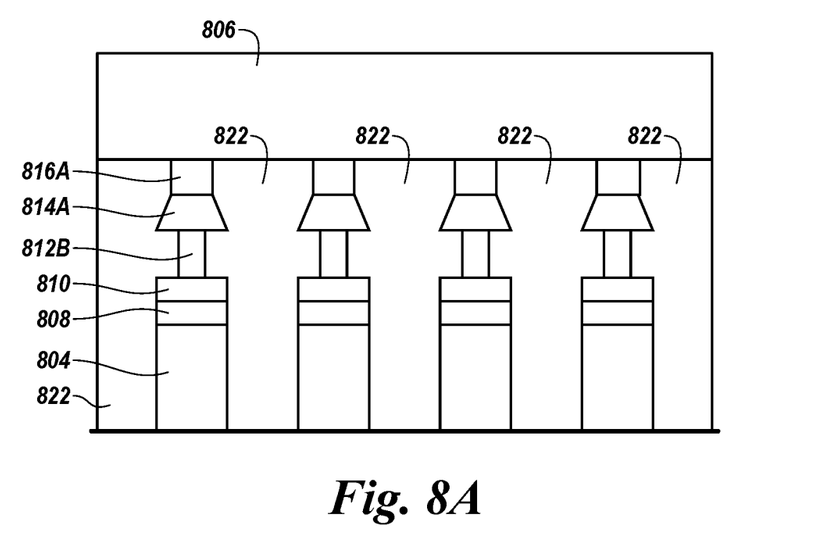
FIGS. 8A and 8B illustrate cross-sectional views of memory cells in parallel directions at different locations having tapered memory elements without stringer defects in accordance with a number of embodiments of the present disclosure.
Figure 8B:
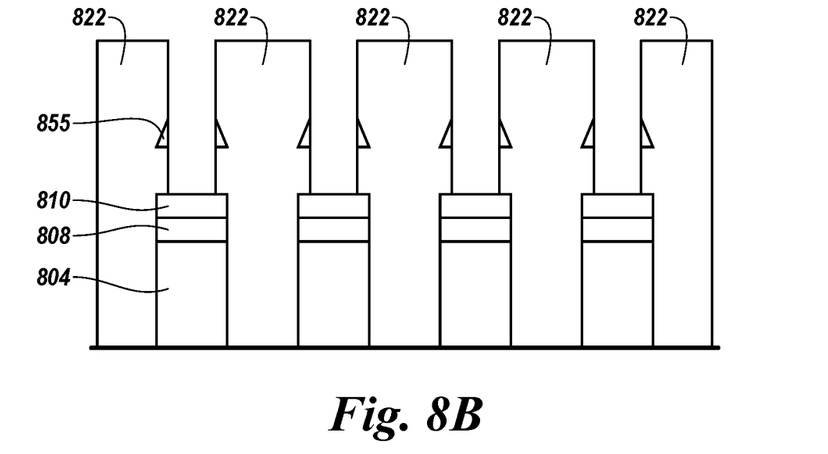

FIGS. 8A and 8B illustrate cross-sectional views of memory cells in parallel directions having tapered memory elements without stringer defects in accordance with a number of embodiments of the present disclosure. FIG. 8A shows a cross-sectional side view sliced through an overlying conductive line, e.g., bit line 806, with pillars separated by dielectric material 822 (in a similar orientation as that shown by cutline 3A-3A in FIG. 1). Each pillar shown in FIG. 8A includes a first electrode 808, e.g., bottom electrode, formed over a first conductive line 804, e.g., word line, a switch element 810 formed over the first electrode 808, a second electrode 812B, e.g., middle electrode, formed over the switch element 810, a memory element 814A formed over the second electrode 812B, and a third electrode 816A formed over the memory element 814A. The bit line 806 extends left-right across the top of the pillars and interposing dielectric 822. The view and memory cell configuration shown in FIG. 8A are similar to that shown in FIG. 6A but with a tapered memory element 814A and narrowed third electrode 816A. FIG. 8A shows the second electrode 812B recessed beneath the tapered memory element 814A.

According to some embodiments, one of the first 808, the second 812B, and/or the third electrode 816A can be etched, via a selective/isotropic process, to have a lateral dimension in a particular direction that is different than, e.g., less than, a lateral dimension of the other electrodes in the same particular direction. For example, one electrode can be etched to be larger, or smaller, than other electrodes. Also, according to some embodiments of the present disclosure, each electrode can be etched to have a different lateral dimension than all other electrodes and/or the switch element 810 and/or the memory element 814A.

FIG. 8B shows a cross-sectional end view in an orientation parallel to the view shown in FIG. 8A, but sliced at a location between the bit lines 806 shown in FIG. 8A. Portions of the previous fin structures after the bit line etch are shown in FIG. 8B, with the fin structures between the bit lines 806 being etched down to the switch element 810. That is, the second electrode 812B between the bit lines 806 has been etched away by the bit line etch to the extent shown in FIG. 8B.

As described above with respect to FIG. 7B, since bit line patterning, e.g., etching, is highly anisotropic, the dielectric material 822 located above the tapered portion 855 of the memory element 814A can shadow the tapered portion 855 of the memory element 814A, which in turn can shadow material therebelow. However, because the second electrode 812B below the memory element 814A has been recessed in the manner previously described, the material below the tapered portion 855 of the memory element 814A is dielectric material 822 rather than conductive second electrode material.

The tapered portion 855 of the memory element 812B can be eliminated after the bit line etch by a subsequent long isotropic over etch. The dielectric material 822 that remains after the tapered portion 855 of the memory element 812B is insulative rather than conductive. That is, the resulting trench from the bit line etch is free from residual materials. As such, conductive stringer defects are eliminated and column-to-column leakage current does not occur via a conductive stringer defect electrical path, thereby avoiding electrical failures in the memory cell array.

Although specific embodiments have been illustrated and described herein, those of ordinary skill in the art will appreciate that an arrangement calculated to achieve the same results can be substituted for the specific embodiments shown. This disclosure is intended to cover adaptations or variations of various embodiments of the present disclosure. It is to be understood that the above description has been made in an illustrative fashion, and not a restrictive one. Combination of the above embodiments, and other embodiments not specifically described herein will be apparent to those of skill in the art upon reviewing the above description. The scope of the various embodiments of the present disclosure includes other applications in which the above structures and methods are used. Therefore, the scope of various embodiments of the present disclosure should be determined with reference to the appended claims, along with the full range of equivalents to which such claims are entitled.

In the foregoing Detailed Description, various features are grouped together in a single embodiment for the purpose of streamlining the disclosure. This method of disclosure is not to be interpreted as reflecting an intention that the disclosed embodiments of the present disclosure have to use more features than are expressly recited in each claim. Rather, as the following claims reflect, inventive subject matter lies in less than all features of a single disclosed embodiment. Thus, the following claims are hereby incorporated into the Detailed Description, with each claim standing on its own as a separate embodiment.

What is claimed is:

1. An apparatus, comprising:
a first outside electrode having a cross-sectional area;
a second outside electrode having a cross-sectional area in a horizontal plane that is greater than the cross-sectional area of the first outside electrode in the horizontal plane;
a middle electrode coupled to the first outside electrode and the second outside electrode, wherein:
the middle electrode is formed from a different material than the first outside electrode and the second outside electrode; and
the middle electrode is formed to have across-sectional area in the horizontal plane that is less than each of the cross-sectional areas of the first outside electrode in the horizontal plane and the second outside electrode in the horizontal plane subsequent to formation of the first outside electrode and the second outside electrode;
a switch element in physical contact with the first outside electrode and the middle electrode; and
a memory element in physical contact with the middle electrode and the second outside electrode, wherein:
the memory element has a tapered shape such that a cross-sectional area of a lower portion of the memory element in the horizontal plane is substantially equal to the cross-sectional area of the first outside electrode in the horizontal plane and a cross-sectional area of an upper portion of the memory element in the horizontal plane is substantially equal to the cross-sectional area of the second outside electrode in the horizontal plane;
the cross-sectional area of the lower portion of the memory element in the horizontal plane is greater than the cross-sectional area of the upper portion of the memory element in the horizontal plane; and
each of the cross-sectional areas of the upper portion and the lower portion of the memory element in the horizontal plane are greater than the cross-sectional area of the middle electrode in the horizontal plane.

2. The apparatus of claim 1, wherein:
the first outside electrode has a lateral dimension associated therewith,
the middle electrode has a lateral dimension associated therewith that is different than the lateral dimension associated with the first outside electrode; and
the second outside electrode has a lateral dimension associated therewith that is the same as the lateral dimension associated with the first outside electrode.

3. The apparatus of claim 2, wherein the lateral dimension associated with the middle electrode is less than the lateral dimension associated with the first outside electrode.

4. The apparatus of claim 1, wherein the middle electrode is formed of a material having a higher etch rate than a material of which at least one of the first outside electrode and the second outside electrode is formed.

5. The apparatus of claim 1, wherein the middle electrode is self-aligned with a conductive line coupled to the first outside electrode or the second outside electrode.

6. The apparatus of claim 1, wherein the middle electrode and at least one of the first outside electrode and the second outside electrode are made from a different material than the switch element.

7. An apparatus, comprising:
a switch element directly coupled to, and in physical contact with, a first outside electrode and a middle electrode;
a second outside electrode coupled to a memory element and the middle electrode, wherein:
a cross-sectional area of the middle electrode in a horizontal plane is less than a cross-sectional area of at least one of the switch element in the horizontal plane and the memory element in a horizontal plane;
the middle electrode is formed to have the cross-sectional area in the horizontal plane that is less than each of the cross-sectional areas of the first outside electrode in the horizontal plane and the second outside electrode in the horizontal plane subsequent to formation of the first outside electrode and the second outside electrode;
the middle electrode is formed from a different material than both the first outside electrode and the second outside electrode; and
the memory element is formed to have a tapered shape such that a first cross-sectional area of a lower portion of the memory element in the horizontal plane is substantially equal to the cross-sectional area of the first outside electrode in the horizontal plane and a cross-sectional area of an upper portion of the memory element in the horizontal plane is substantially equal to the cross-sectional area of the second outside electrode in the horizontal plane, wherein:
the cross-sectional area of the lower portion of the memory element in the horizontal plane is greater than the cross-sectional area of the upper portion of the memory element in the horizontal plane; and
each of the cross-sectional areas of the upper portion and the lower portion of the memory element in the horizontal plane are greater than the cross-sectional area of the middle electrode in the horizontal plane.

8. The apparatus of claim 7, wherein a lateral dimension associated with the middle electrode is less than a lateral dimension associated with at least one of the switch element and the memory element.

9. The apparatus of claim 7, wherein the switch element extends continuously along a word line coupled to the apparatus.

10. The apparatus of claim 7, wherein the first outside electrode extends continuously along a word line coupled to the apparatus.

11. The apparatus of claim 7, wherein the middle electrode is formed of a material having a higher etch rate with $O_2$-based chemistries than an etch rate of material of which the first outside electrode is formed and an etch rate of material of which the second outside electrode is formed.

* * * * *